(12) United States Patent
Lin et al.

(10) Patent No.: US 10,620,656 B2
(45) Date of Patent: Apr. 14, 2020

(54) OPERATING VOLTAGE SWITCHING DEVICE WITH CURRENT MIRROR

(71) Applicant: Realtek Semiconductor Corp., Hsinchu (TW)

(72) Inventors: Chih-Cheng Lin, Hsinchu (TW); Kai-Yin Liu, Kao Hsiung (TW); Hui-Min Huang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/863,069

(22) Filed: Jan. 5, 2018

(65) Prior Publication Data
US 2018/0196458 A1    Jul. 12, 2018

(30) Foreign Application Priority Data
Jan. 6, 2017    (TW) .............................. 106100387 A

(51) Int. Cl.
*G05F 3/26* (2006.01)
*H02M 1/00* (2006.01)
(Continued)

(52) U.S. Cl.
CPC ................ *G05F 3/262* (2013.01); *G05F 1/10* (2013.01); *G06F 1/3203* (2013.01); *H02J 3/38* (2013.01);
(Continued)

(58) Field of Classification Search
CPC ..... G05F 1/10; G05F 1/46; G05F 3/24; G05F 3/262; H02M 2001/0009; H02M 2001/0032; G06F 1/3203; G06F 1/3246; Y02B 70/16; Y10T 307/696; Y10T 307/724; Y10T 307/729; Y10T 307/735; H02J 3/06; H02J 3/38; H02J 3/40;
(Continued)

(56) References Cited

U.S. PATENT DOCUMENTS 6,344,769 B1 * 2/2002 Giuroiu .................. G05F 3/262
323/315
6,897,717 B1 * 5/2005 Eddleman ............... G05F 3/262
327/108
(Continued)

FOREIGN PATENT DOCUMENTS

CN            100476680 C     4/2009

*Primary Examiner* — Nguyen Tran
*Assistant Examiner* — David A. Singh
(74) *Attorney, Agent, or Firm* — Muncy, Geissler, Olds & Lowe, P.C.

(57) ABSTRACT

An operating voltage switching device includes a first current mirror circuit generating a corresponding sensing current according to an input current; a comparator comparing a reference voltage with a voltage at a node of the first current mirror circuit to generate a comparison signal; a first power domain providing a first output current to an internal circuit according to the sensing current; a second power domain providing a second output current to the internal circuit according to the sensing current; and a power domain selecting circuit, which is coupled to the comparator, the first power domain and the second power domain, and selects to enable the first power domain or the second power domain according to the comparison signal; wherein the sensing current is not greater than the input current.

10 Claims, 3 Drawing Sheets

(51) Int. Cl.
   G06F 1/3203  (2019.01)
   H03K 17/30   (2006.01)
   H03K 19/00   (2006.01)
   G05F 1/10       (2006.01)
   H03K 17/08      (2006.01)
   H02J 3/38       (2006.01)
   H02J 3/40       (2006.01)

(52) U.S. Cl.
   CPC ........ *H02J 3/40* (2013.01); *H02M 2001/0009* (2013.01); *H02M 2001/0032* (2013.01); *H03K 17/08* (2013.01); *H03K 17/30* (2013.01); *H03K 19/0008* (2013.01); *H03K 2217/0036* (2013.01); *Y02B 70/16* (2013.01); *Y10T 307/696* (2015.04); *Y10T 307/724* (2015.04); *Y10T 307/729* (2015.04)

(58) Field of Classification Search
   CPC .......... H02J 3/42; H02J 3/44; H02J 2003/388; H02J 9/005; H02J 9/04; H02J 9/06; H03K 5/2418; H03K 5/2445; H03K 5/2481; H03K 17/063; H03K 17/10; H03K 17/102; H03K 17/122; H03K 17/13; H03K 17/133; H03K 17/145; H03K 17/16; H03K 17/161–167; H03K 17/223; H03K 17/284; H03K 17/30; H03K 17/302; H03K 17/691; H03K 17/693; H03K 2017/6875; H03K 2017/6878; H03K 19/0008; H03K 19/0013; H03K 19/0016; H03K 2217/0036

USPC ......... 323/215; 327/51–53, 63–66, 108–112, 327/427, 538, 543, 544, 547; 307/80, 307/85–87, 116, 125–131

See application file for complete search history.

(56) References Cited

U.S. PATENT DOCUMENTS

| | | | | |
|---|---|---|---|---|
| 6,987,333 | B2* | 1/2006 | Winick | H02J 1/102 |
| | | | | 307/85 |
| 7,265,605 | B1* | 9/2007 | Vasudevan | G05F 1/56 |
| | | | | 327/534 |
| 8,400,849 | B1* | 3/2013 | Dornseifer | G11C 5/144 |
| | | | | 365/145 |
| 9,342,084 | B1* | 5/2016 | Konecny | G05F 1/463 |
| 2005/0174099 | A1* | 8/2005 | Ohkubo | H03M 1/745 |
| | | | | 323/315 |
| 2008/0265683 | A1* | 10/2008 | Zhu | H02J 1/08 |
| | | | | 307/80 |
| 2010/0026377 | A1* | 2/2010 | Weder | G05F 1/561 |
| | | | | 327/538 |
| 2013/0221942 | A1* | 8/2013 | Hu | H03F 3/45183 |
| | | | | 323/282 |
| 2014/0145777 | A1* | 5/2014 | Ma | H03K 3/356165 |
| | | | | 327/333 |
| 2016/0036444 | A1* | 2/2016 | Li | H03K 19/01754 |
| | | | | 327/333 |

* cited by examiner

OPERATING VOLTAGE SWITCHING DEVICE WITH CURRENT MIRROR

BACKGROUND OF THE INVENTION

This application claims priority of No. 106100387 filed in Taiwan R.O.C. on Jan. 6, 2017 under 35 USC 119, the entire content of which is hereby incorporated by reference.

Field of the Invention

The invention relates to an operating voltage switching device and more particularly to an operating voltage switching device capable of selecting a power domain to reduce power consumption.

Description of the Related Art

FIG. 1 shows a conventional current detecting circuit 100, which includes a transistor 101 and a resistor 102 connected in series on a power path, and detects voltages on two ends of the resistor 102 to achieve the object of current detection.

FIG. 2 is a schematic view showing another conventional current detecting circuit, in which current detection NMOS transistors are used to function as a current mirror. In this prior art, the current induced by the NMOS current mirror flows from a current block to the ground, but the voltage of the drain of the current detection NMOS ranges from the operating voltage to the ground voltage. However, a typical low operating voltage cannot provide the application of the full voltage range. If a high operating voltage is used as the input voltage for providing power, then very high power consumption (wherein P=I/N*VIN) is caused during heavy load condition.

SUMMARY OF THE INVENTION

An Objective of the invention is to provide an operating voltage switching device, which can select a power domain to reduce the power consumption.

The invention provides an operating voltage switching device comprising: a first current mirror circuit generating a corresponding sensing current according to an input current; a comparator comparing a reference voltage with a voltage at a node of the first current mirror circuit to generate a comparison signal; a first power domain providing a first output current to an internal circuit according to the sensing current; a second power domain providing a second output current to the internal circuit according to the sensing current; and a power domain selecting circuit, which is coupled to the comparator, the first power domain and the second power domain, and selects to enable the first power domain or the second power domain according to the comparison signal; wherein the sensing current is not greater than the input current.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

DETAILED DESCRIPTION OF THE INVENTION

Figure 1:
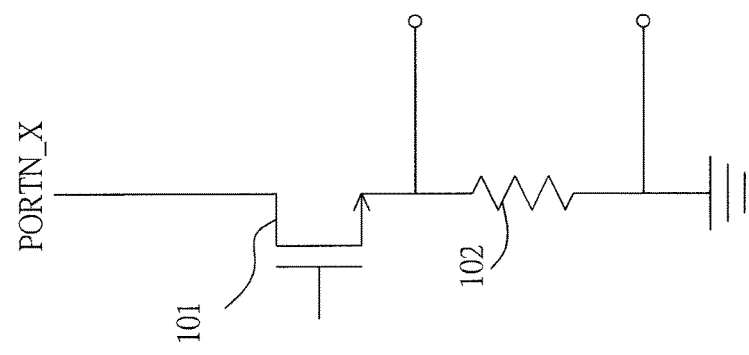
FIG. 1 is a schematic view showing a conventional current detecting circuit.
Figure 2:
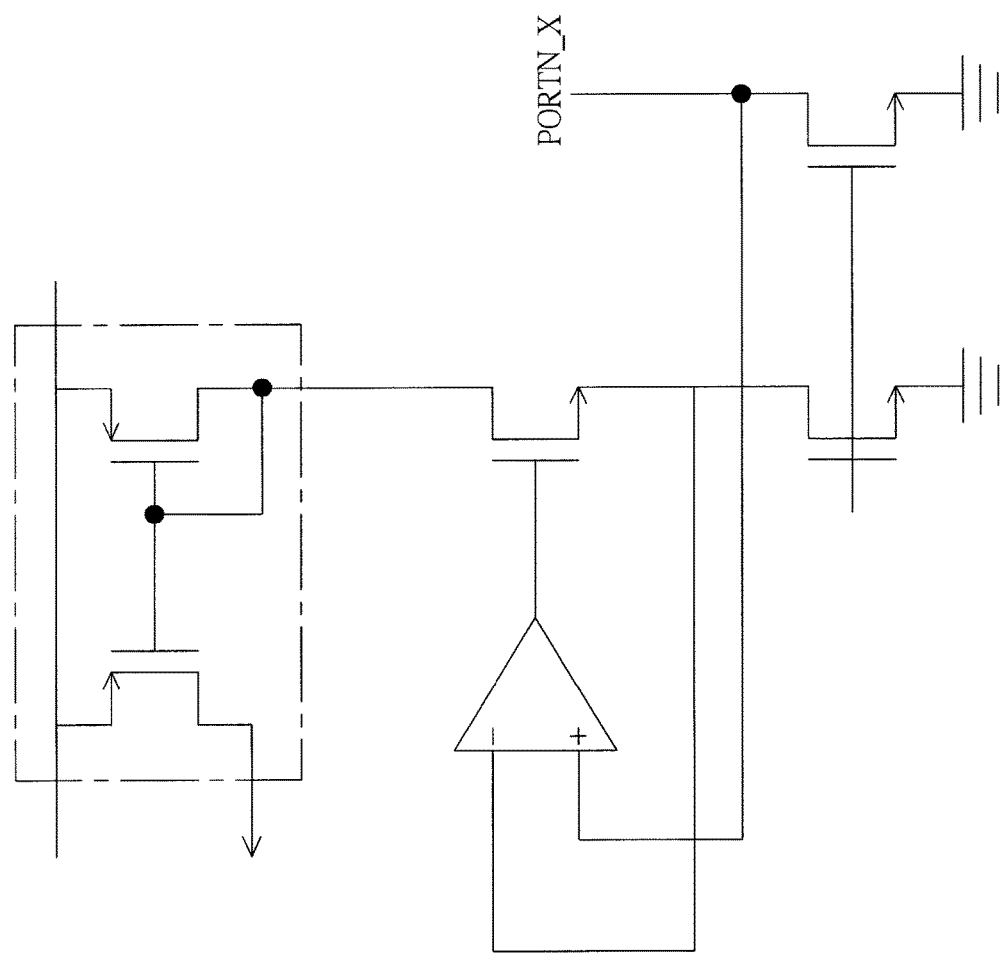
FIG. 2 is a schematic view showing another conventional current detecting circuit.
Figure 3:
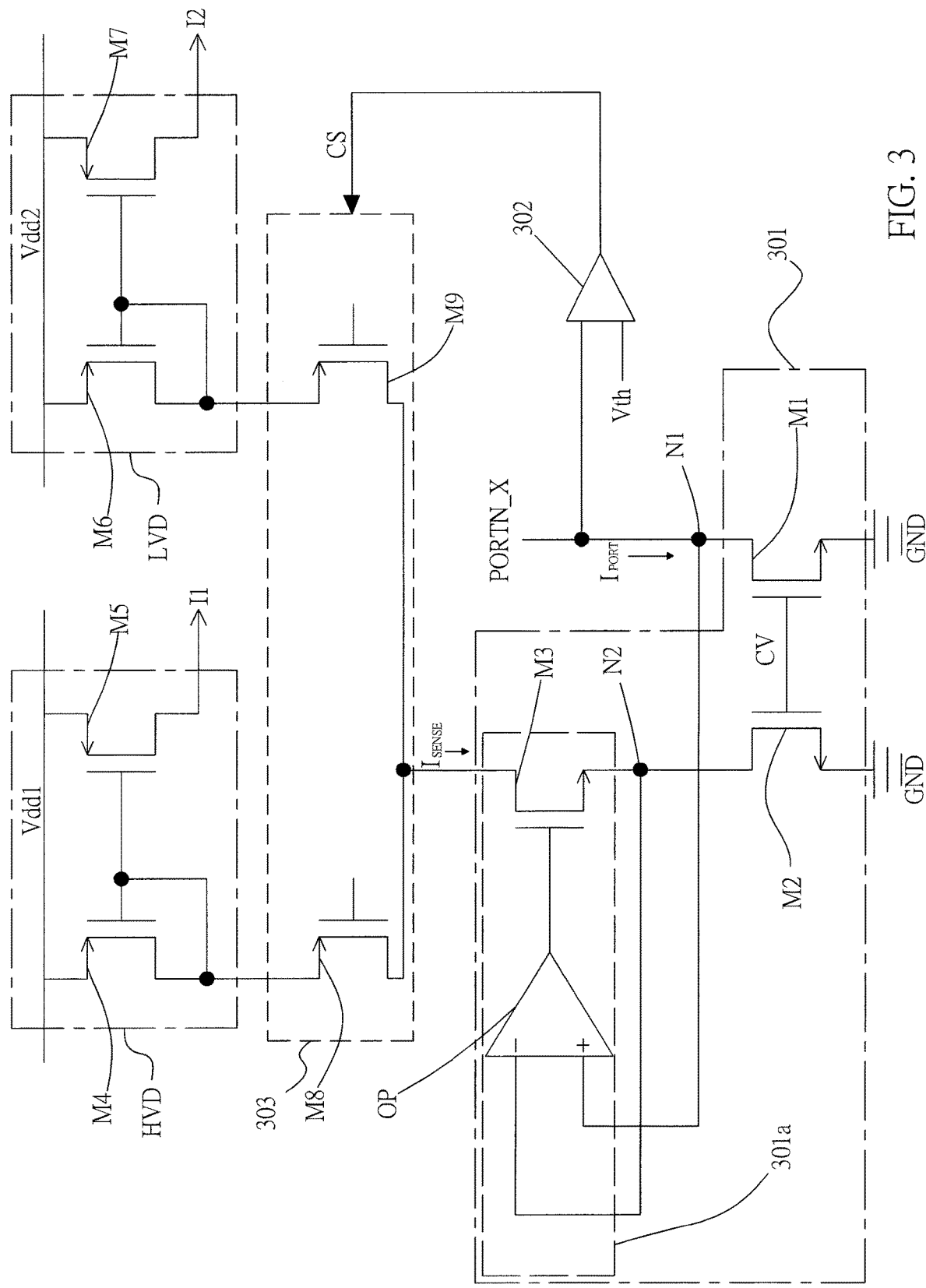
FIG. 3 is a schematic view showing an operating voltage switching device according to an embodiment of the invention.

FIG. 3 is a schematic view showing an operating voltage switching device 300 according to an embodiment of the invention. The operating voltage switching device 300 includes a current mirror circuit 301, a comparator 302, a power domain HVD, a power domain LVD and a power domain selecting circuit 303. The power domains HVD and LVD can output the output currents I1 and I2 to an internal circuit (not shown), which may be an analog circuit or a digital circuit and will not be described in detailed herein. In one embodiment, the output currents I1 and I2 are substantially equal to each other, and the power domain selecting circuit 303 selects the power domain HVD or LVD to operate to reduce the overall power consumption of the current detecting circuit.

In an embodiment of the invention, the operating voltage of the power domain HVD is higher than that of the power domain LVD.

In another embodiment of the invention, the current mirror circuit 301 includes a voltage regulating circuit 301a, and enables an input current $I_{PORT}$ of the current mirror circuit 301 to generate a sensing current $I_{SENSE}$ according to a control voltage CV; the voltage regulating circuit 301a is coupled to the nodes N1 and N2 in the current mirror circuit 301, and the input current $I_{PORT}$ and the sensing current $I_{SENSE}$ flow through the nodes N1 and N2, respectively. The voltage regulating circuit 301a regulates the voltages at the nodes N1 and N2 to make the voltages at the nodes N1 and N2 be substantially equal to each other.

The comparator 302 compares a reference voltage $V_{TH}$ with the voltage at the node N1 or N2 to generate a comparison signal CS. The power domains HVD and LVD generate the output currents I1 and I2 to the internal circuit according to the sensing current $I_{SENSE}$, respectively. In this embodiment, the comparator 302 may compare the voltage at the node N1 or N2 with the reference voltage $V_{TH}$, but the invention is not restricted thereto. If those skilled in the art adopt the current mirror circuit 301 using another architecture, then the comparator 302 can determine the node that is to be compared according to the architecture of the current mirror circuit 301.

The power domain selecting circuit 303 is coupled to the comparator 302 and the power domains HVD and LVD, and selects to enable the power domain HVD or LVD according to the comparison signal CS.

It is to be noted that the sensing current $I_{SENSE}$ is not greater than the input current $I_{PORT}$ in this embodiment, and the input current $I_{PORT}$ is transmitted from the external circuit of the chip to this device 300. In another embodiment, the power domain selecting circuit 303 may also disable the power domains HVD and LVD concurrently.

In this embodiment, the current mirror circuit 301 includes transistors M1 and M2. The transistor M1 has a drain coupled to the node N1, and a source coupled to the ground GND. Also, the transistor M2 has a drain coupled to the node N2, and a source coupled to the ground GND. The gate of the transistor M2 is coupled to the gate of the transistor M1. The gates of the transistors M1 and M2 are turned on according to the control voltage CV to make the transistor M2 generate the sensing current $I_{SENSE}$ according to the input current $I_{PORT}$ inputted to the transistor M1. The input current $I_{PORT}$ flows through the node N1, and the sensing current $I_{SENSE}$ flows through the node N2.

In this embodiment, when the aspect ratio of the transistor M1 is configured to be N times that of the transistor M2, the sensing current $I_{SENSE}$ is substantially equivalent to 1/N times of the input current $I_{PORT}$. So, the architecture of the current mirror circuit 301 is utilized to make the sensing current $I_{SENSE}$ be smaller than the input current $I_{PORT}$ to reduce the power consumption on the circuit path of the sensing current $I_{SENSE}$.

In an embodiment of the invention, the voltage regulating circuit 301a includes an operational amplifier OP and a transistor M3. The operational amplifier OP has an inverting input terminal, a non-inverting input terminal and an output terminal. The transistor M3 has a gate coupled to the output terminal, a drain coupled to the power domain selecting circuit 303 and a source coupled to the node N2.

The non-inverting input terminal of the operational amplifier OP is coupled to the node N1, and the inverting input terminal of the operational amplifier OP is coupled to the node N2. The operational amplifier OP enables the transistor M3 to regulate the voltage at the node N2 according to the voltage of the node N1, so that the voltage at the node N1 is substantially equal to the voltage at the node N2. The source of the transistor M3 of this embodiment is coupled to the inverting input terminal of the operational amplifier OP in a negative feedback manner to control the voltages at the nodes N1 and N2 to be equal to each other, so the precision of the current value of the sensing current $I_{SENSE}$, which can be sensed by the current mirror circuit 301, can be enhanced.

Also, the power domain HVD includes transistors M4 and M5. In this embodiment, the transistors M4 and M5 are coupled to form a structure of a current mirror. The transistor M4 has a source coupled to an operating voltage Vdd1, and a drain coupled to a gate of the transistor M4. The transistor M5 has a source coupled to the operating voltage Vdd1, and a gate coupled to the gate of the transistor M4. When the power domain selecting circuit 303 selects the power domain HVD to operate, the drain of the transistor M5 generates the output current I1 to the internal circuit according to the sensing current $I_{SENSE}$.

Similarly, the power domain LVD includes transistors M6 and M7. In this embodiment, the transistors M6 and M7 are also coupled to form a structure of a current mirror. The transistor M6 has a source coupled to an operating voltage Vdd2, and a drain coupled to a gate of the transistor M6. The transistor M7 has a source coupled to the operating voltage Vdd2, and a gate coupled to the gate of the transistor M6. When the power domain selecting circuit 303 selects the power domain LVD to operate, the drain of the transistor M7 generates the output current I2 to the internal circuit according to the sensing current $I_{SENSE}$.

It is to be noted that the output current I1 is substantially a multiple of the output current I2 in this embodiment, wherein the multiple may be 1 or greater than 1. The transistors M4 and M5 are the high-voltage elements, and the transistors M6 and M7 are the low-voltage elements. That is, different voltage-withstanding elements are adopted in the power domains HVD and LVD. In another embodiment, the operating voltage Vdd2 is lower than the operating voltage Vdd1.

In addition, the power domain selecting circuit 303 includes transistors M8 and M9 in this embodiment. The transistors M8 and M9 receive the comparison signal CS from the comparator 302 to determine to selectively enable the power domain HVD or the power domain LVD.

As mentioned hereinabove, when the voltage at the node N1 is higher than the reference voltage $V_{TH}$, the comparison signal CS enables the transistor M8, so that the power domain HVD adopting the high-voltage element operates to output the output current I1. When the voltage at the node N1 is smaller than the reference voltage $V_{TH}$, the comparison signal CS enables the transistor M9, so that the power domain LVD adopting the low-voltage element operates to output the output current I2.

The invention utilizes the power domain selecting circuit 303 to select one of the power domains HVD and LVD with different operating voltages to operate. It is possible to prevent all the operations from being powered by the input voltage of the high operating voltage to reduce the overall device loading and thus the power consumption.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. An operating voltage switching device, comprising:
   a first current mirror circuit generating a corresponding sensing current according to an input current;
   a comparator comparing a reference voltage with a voltage at a first node of the first current mirror circuit to generate a comparison signal;
   a first power domain providing a first output current to an internal circuit according to the sensing current;
   a second power domain providing a second output current to the internal circuit according to the sensing current; and
   a power domain selecting circuit, which is coupled to the comparator, the first power domain and the second power domain, and selects to enable exclusively only one of the first power domain and the second power domain according to the comparison signal.

2. The operating voltage switching device according to claim 1, wherein the first current mirror circuit comprises:
   a voltage regulating circuit coupled to the first node and a second node of the first current mirror circuit, wherein the input current and the sensing current flow through the first node and the second node, respectively, the voltage regulating circuit being configured to regulate the voltage at the first node and a voltage at the second node to make the voltages at the first and second nodes be substantially equal to each other.

3. The operating voltage switching device according to claim 2, wherein the first current mirror circuit comprises:
   a first transistor having a drain coupled to the first node, and a source coupled to a ground; and
   a second transistor having a drain coupled to the second node, and a source coupled to the ground;
   wherein a gate of the second transistor is coupled to a gate of the first transistor, so that the second transistor generates the sensing current according to the input current; and the input current flows through the first node, and the sensing current flows through the second node.

4. The operating voltage switching device according to claim 3, wherein the voltage regulating circuit comprises:

an operational amplifier having an inverting input terminal, a non-inverting input terminal and an output terminal; and a third transistor having a gate coupled to the output terminal, a drain coupled to the power domain selecting circuit, and a source coupled to the second node;

wherein the non-inverting input terminal is coupled to the first node, and the inverting input terminal is coupled to the second node.

5. The operating voltage switching device according to claim 4, wherein the first power domain comprises:

a fourth transistor having a source coupled to a first operating voltage, and a drain coupled to a gate of the fourth transistor; and a fifth transistor having a source coupled to the first operating voltage, and a gate coupled to the gate of the fourth transistor;

wherein when the power domain selecting circuit selects the first power domain to operate, the fifth transistor generates the first output current according to the sensing current.

6. The operating voltage switching device according to claim 5, wherein the second power domain comprises:

a sixth transistor having a source coupled to a second operating voltage, and a drain coupled to a gate of the sixth transistor; and a seventh transistor having a source coupled to the second operating voltage, and a gate coupled to the gate of the sixth transistor;

wherein when the power domain selecting circuit selects the second power domain to operate, the seventh transistor generates the second output current according to the sensing current.

7. The operating voltage switching device according to claim 6, wherein the power domain selecting circuit comprises:

an eighth transistor receiving the comparison signal to determine whether to enable the first power domain or not; and a ninth transistor receiving the comparison signal to determine whether to enable the second power domain or not.

8. The operating voltage switching device according to claim 7, wherein when the voltage at the first node is higher than the reference voltage, the comparison signal enables the eighth transistor to make the first power domain operate to output the first output current; and when the voltage at the first node is smaller than the reference voltage, the comparison signal enables the ninth transistor to make the second power domain operate to output the second output current.

9. The operating voltage switching device according to claim 6, wherein different voltage-withstanding elements are adopted in the first power domain and the second power domain.

10. The operating voltage switching device according to claim 1, wherein the sensing current is smaller than the input current.

* * * * *